United States Patent
Li et al.

(10) Patent No.: US 8,127,207 B2
(45) Date of Patent: Feb. 28, 2012

(54) METHOD FOR PROCESSING PACKETS, AN APPARATUS FOR TRANSMITTING PACKETS, AND AN APPARATUS FOR RECEIVING PACKETS

(75) Inventors: Yutian Li, Hanzhou (CN); Gang Zhao, Hanzhou (CN)

(73) Assignee: Hangzhou H3C Technologies Co., Ltd., Zhejiang (CN)

( * ) Notice: Subject to any disclaimer, the term of this patent is extended or adjusted under 35 U.S.C. 154(b) by 775 days.

(21) Appl. No.: 12/300,965

(22) PCT Filed: May 10, 2007

(86) PCT No.: PCT/CN2007/070009
§ 371 (c)(1),
(2), (4) Date: Nov. 14, 2008

(87) PCT Pub. No.: WO2008/049341
PCT Pub. Date: May 2, 2008

(65) Prior Publication Data
US 2009/0271685 A1  Oct. 29, 2009

(30) Foreign Application Priority Data
Oct. 24, 2006 (CN) .......................... 2006 1 0150597

(51) Int. Cl.
*G06F 11/00* (2006.01)

(52) U.S. Cl. ...................................................... 714/776
(58) Field of Classification Search .................... 714/776
See application file for complete search history.

(56) References Cited

U.S. PATENT DOCUMENTS

| | | | |
|---|---|---|---|
| 5,608,738 | A | 3/1997 | Matsushita |
| 5,870,412 | A | 2/1999 | Schuster et al. |
| 6,081,907 | A | 6/2000 | Witty et al. |
| 6,145,109 | A | 11/2000 | Schuster et al. |
| 6,151,636 | A | 11/2000 | Schuster et al. |
| 6,170,075 | B1 | 1/2001 | Schuster et al. |
| 6,226,769 | B1 | 5/2001 | Schuster et al. |
| 6,243,846 | B1 | 6/2001 | Schuster et al. |
| 6,487,690 | B1 | 11/2002 | Schuster et al. |
| 6,732,314 | B1 | 5/2004 | Borella et al. |
| 6,771,674 | B1 | 8/2004 | Schuster et al. |
| 6,785,261 | B1 | 8/2004 | Schuster et al. |
| 7,853,856 | B2 * | 12/2010 | Vedantham et al. .......... 714/776 |
| 2005/0160346 | A1 * | 7/2005 | Yamane ........................ 714/776 |

(Continued)

FOREIGN PATENT DOCUMENTS

CN          1622504 A          6/2005
(Continued)

OTHER PUBLICATIONS

Abstract, Aug. 31, 2002—Non-patent reference listed in Office Action dated Dec. 19, 2008 of CN Patent Application No. 200610150597.3 filed on Oct. 24, 2006.

*Primary Examiner* — Bryce Bonzo

(57) ABSTRACT

The present invention discloses a packet processing method, comprising: A. the transmitter acquiring the redundancy information based on the payload of at least one transmitted packet and transmitting the redundancy information to the receiver; B. the receiver restoring the payload of the abnormal packet according to the redundancy information relating to the abnormal packet. The present invention also discloses the packet transmitting apparatuses and packet receiving apparatuses. By performing error correction and restoration for abnormal packets, the present invention improves packet transmission reliability and thus the quality of transmitted media streams.

21 Claims, 8 Drawing Sheets

U.S. PATENT DOCUMENTS

| | | | |
|---|---|---|---|
| 2005/0249211 A1* | 11/2005 | Chou et al. | 370/389 |
| 2006/0075321 A1* | 4/2006 | Vedantham et al. | 714/776 |
| 2006/0282749 A1* | 12/2006 | Guo | 714/776 |
| 2007/0079222 A1* | 4/2007 | Kure et al. | 714/776 |
| 2008/0134005 A1* | 6/2008 | Izzat et al. | 714/774 |
| 2009/0327842 A1* | 12/2009 | Liu et al. | 714/776 |

FOREIGN PATENT DOCUMENTS

| | | |
|---|---|---|
| WO | 97/38549 A1 | 10/1997 |
| WO | 99/30462 A2 | 6/1999 |

* cited by examiner

Unit: bytes

METHOD FOR PROCESSING PACKETS, AN APPARATUS FOR TRANSMITTING PACKETS, AND AN APPARATUS FOR RECEIVING PACKETS

TECHNICAL FIELD

This invention relates in general to network packet transmission technology and more particularly to a method for processing packets, an apparatus for transmitting packets, and an apparatus for receiving packets.

BACKGROUND OF THE INVENTION

As a transport layer protocol in the Transmission Control Protocol/Internet Protocol (TCP/IP) protocol suite, the User Datagram Protocol (UDP) is mainly adopted for network applications to transmit data between computers.

Different from TCP, UDP is a connectionless protocol, which is responsible only for data encapsulation and transmission and does not provide any retransmission mechanism. Because UDP introduces less delay and is faster, it is often used to transmit delay-sensitive media streams such as voice and video.

Because of the absence of a retransmission mechanism, UDP, however, can hardly handle problems such as packet loss and packet reordering, which are typical of an IP-based network. FIG. 1 is a schematic diagram illustrating these transmission problems. As shown in FIG. 1, the transmitter transmits nine sequential packets to the receiver. If the receiver fails to receive packet 5, packet loss occurs; if the receiver receives packet 2 after receiving packet 9, reordering occurs; if the receiver receives packet 2 after a long time, for example, after receiving packet 200, large-scale reordering occurs. When the packet loss occurs, the receiver cannot recover the lost packet because UDP does not provide a retransmission mechanism. When reordering occurs, the UDP receiver will wait for out-of-order packets for a period and reorder the out-of-order packets at the application layer after receiving them. When large-scale reordering occurs, the receiver may fail to receive an out-of-order packet when the timer expires. In this case, UDP regards the out-of-order packet as a lost packet, and thus the packet cannot be restored. As the existing UDP packet processing method cannot deal with reordering and packet loss, the reliability of UDP is low and problems such as jerky, unclear speech, and distorted, blurry, grainy images are common with the media streams transmitted in UDP.

SUMMARY OF THE INVENTION

The present invention provides a packet processing method to improve UDP transmission reliability.

The packet processing method comprises:

A. The transmitter calculating redundancy information based on the payload of at least one transmitted packet and transmitting the calculated redundancy information to the receiver;

B. The receiver, upon detection of a packet anomaly, restoring the payload of the abnormal packet according to the redundancy information relevant to the abnormal packet.

Wherein, before the step A, the method further comprises segmenting the payload of each transmitted packet into n (an integer equal to or greater than 1) data blocks.

Wherein, the calculating redundancy information at step A comprises extracting a data block from each of the n packets sent before the packet waiting for transmission, performing redundancy calculation for the extracted data blocks, and taking the calculation result as the redundancy information.

Wherein, the transmitting the redundancy information to the receiver at step A comprises encapsulating the redundancy information and the payload to be transmitted in the packet waiting for transmission, and then transmitting the packet to the receiver;

Wherein, the restoring the payload of the abnormal packet comprises performing redundancy-based error correction based on the data blocks of the (n−1) packets before the abnormal packet and the n packets after the abnormal packet and the redundancy information, and then restoring the data blocks of the abnormal packet.

Wherein, the segmenting the payload of each transmitted packet into n data blocks comprises:

determining the remaining free length of the transmitted packet, calculating the minimum number of data blocks based on the determined remaining free length, and selecting an integer n equal to or greater than the calculated minimum number of blocks;

dividing the payload length of the transmitted packet by the n; if the result is an integer, taking the result as the data block length, and if not, taking one plus the floor of the result as the data block length;

segmenting the payload of the transmitted packet into data blocks of the data block length.

Wherein, the determining the remaining free length of the transmitted packet comprises checking the encapsulation format of the transmitted packet, and then deducting the length of a packet in such an encapsulation format from the maximum transmission unit to get the remaining free length.

Wherein, the calculating the minimum number of data blocks based on the determined remaining free length comprises:

dividing the payload length of the transmitted packet by the remaining free length; if the result is an integer, taking the result as the minimum number of data blocks, and if not, taking one plus the floor of the result as the minimum number of data blocks.

Wherein, the performing redundancy calculation for the extracted data blocks comprises:

constructing redundancy calculation matrix A using the extracted data blocks:

$$A = \begin{bmatrix} A_{1,1} & \times & \ldots & \times & \times \\ \times & A_{2,2} & \ldots & \times & \times \\ \ldots & \ldots & \ldots & \ldots & \ldots \\ \times & \times & \ldots & A_{n,n} & \times \\ \times & \times & \ldots & \times & A_{n+1,n+1} \end{bmatrix}$$

where $A_{i,i}$ (i=1, 2, ..., n) represents the $i^{th}$ data block of the $i^{th}$ packet of the n successive packets transmitted before the packet waiting for transmission, $A_{n+1, n+1}$ represents the redundancy information to be calculated for the packet waiting for transmission. When the data length of $A_{i,i}$ is less than that of $A_{1,1}$, the deficient bits are set to 0; when $A_{i,i}$ is null, $A_{i,i}$ is set to 0.

Performing bitwise XOR operations on the extracted n data blocks to get the redundancy information $A_{n+1,n+1} = A_{1,1} \oplus A_{2,2} \oplus \ldots \oplus A_{n,n}$, where the encircled plus sign ($\oplus$) symbolizes bitwise XOR.

Wherein, the performing redundancy-based error correction to restore the data blocks of the abnormal packet at step B comprises:

constructing error correction calculation matrix B using the data blocks of the (n−1) successive packets before the abnormal packet and the n successive packets after the abnormal packet and the redundancy information:

$$B = \begin{bmatrix} B_{1,1} & B_{2,1} & \cdots & B_{n-1,1} & B_{n,1} & B_{n+1,1} & \cdots & \cdots & B_{2n,1} \\ B_{1,2} & B_{2,2} & \cdots & \cdots & B_{n,2} & B_{n+1,2} & \cdots & \cdots & \cdots \\ \cdots & \cdots & \cdots & B_{n-1,n-1} & \cdots & B_{n+1,3} & \cdots & \cdots & \cdots \\ \cdots & \cdots & \cdots & B_{n-1,n} & B_{n,n} & \cdots & \cdots & B_{2n-1,n} & \cdots \\ B_{1,n+1} & \cdots & \cdots & B_{n-1,n+1} & B_{n,n+1} & B_{n+1,n+1} & \cdots & B_{2n-1,n+1} & B_{2n,n+1} \end{bmatrix}$$

where $B_{i,j}$ (i=1, 2, . . . , n−1, j=1, 2, . . . , n) represents the $j^{th}$ data block of the $i^{th}$ packet of the (n−1) packets transmitted before the abnormal packet, $B_{i,j}$ (i=n+1, n+2, . . . , 2n, j=1, 2, . . . , n) represents the $j^{th}$ data block of the $i^{th}$ packet of the n packets transmitted after the abnormal packet, $B_{n,j}$ (j=1, 2, . . . , n) represents the $j^{th}$ data block of the abnormal packet to be restored, and $B_{i,n+1}$ (i=1, 2, . . . , 2n) represents the redundancy information of each packet participating in error correction calculation;

using the following formulas to bitwise XOR the elements in error correction calculation matrix B to get each data block of the abnormal packet:

$B_{n,1} = B_{n+1,2} \oplus B_{n+2,3} \oplus B_{n+3,4} \oplus \ldots \oplus B_{2n,n+1},$ $B_{n,2} = B_{n-1,1} \oplus B_{n+1,3} \oplus B_{n+2,4} \oplus \ldots \oplus B_{2n-1,n+1},$ $B_{n,3} = B_{n-2,1} \oplus B_{n-1,2} \oplus B_{n+1,4} \oplus \ldots \oplus B_{2n-2,n+1},$

. . .

$B_{n,n} = B_{1,1} \oplus B_{2,2} \oplus \ldots \oplus B_{n-1,n-1} \oplus B_{n+1,n+1}.$ Wherein, before the step A, the method further comprises identifying the number of backup packets (represented by m, an integer equal to or greater than 1).

Wherein the calculating redundancy information at Step A comprises backing up the payloads of the m packets transmitted before the packet waiting for transmission and taking the backup data as the redundancy information.

Wherein the transmitting the redundancy information to the receiver at step A comprises encapsulating the redundancy information and the payload to be transmitted in the packet waiting for transmission, and then transmitting the packet to the receiver;

Wherein, the restoring the payload of the abnormal packet comprises: identifying the packet where the payload of the abnormal packet is backed up according to the m and the place of the abnormal packet in the received packet, acquiring the redundancy information from the identified packet, and then restoring the payload of the abnormal packet based on the acquired redundancy information.

Wherein, the determining the number of backup packets m comprises:

identifying the remaining free length of the transmitted packet, dividing the remaining free length by the payload length of the transmitted packet, taking the floor of the division result as the maximum number of backup packets, and then selecting an integer m less than or equal to the maximum number of backup packets.

Wherein, the redundancy information contains at least one redundancy check block, which backs up the payload of one packet.

At step A, the encapsulating the redundancy information and the payload to be transmitted in the packet waiting for transmission comprises: adding the payload of the $i^{th}$ packet before the packet waiting for transmission to the packet waiting for transmission as the content of the $i^{th}$ redundancy check block, encapsulating the payload of the packet waiting for transmission and the m redundancy check blocks, and then transmitting the encapsulated packet to the receiver, where i=1, 2, . . . , m.

At step B, the restoring the payload of the abnormal packet comprises: using the content of $i^{th}$ redundancy check block of the $i^{th}$ packet after the abnormal packet as the payload of the abnormal packet to restore the abnormal packet.

Preferably, the encapsulating further comprises adding a check identification code before the redundancy information to identify the redundancy information.

Preferably, the check identification code further comprises the original sequence information of the packet.

Before the step B, the method further comprises:

B01: acquiring the original sequence information of the received packet based on its check identification code to check whether the received packet and its previous packet are adjacent, and determining that no packet anomaly occurs if they are adjacent, or executing step B02 if they are not adjacent;

B02: determining where packet loss occurs: if the lost packet is not received when the predefined timer expires, the receiver determines that a packet anomaly occurs and the lost packet is an abnormal packet, and then executes the step B; if the lost packet is received before the timer expires, the method determines that no packet anomaly occurs.

Preferably, before step A, the method further comprises determining the number of packets (represented by k, an integer equal to or greater than 1) required for calculating redundancy information;

At step A, the calculating redundancy information comprises: organizing every k packets into a packet group, performing a bitwise XOR on the payload of all transmitted packets in the packet group, and taking the XOR result as the redundancy information;

At step A, the transmitting the redundancy information to the receiver comprises: encapsulating the redundancy information in a redundancy check packet and transmitting the packet to the receiver;

At step B, the restoring the payload of the abnormal packet comprises: extracting the redundancy information from the redundancy check packet for the abnormal packet, performing a bitwise XOR on the extracted redundancy information with the payload of the normal packets in the corresponding packet group, and taking the XOR result as the payload of the abnormal packet.

The present invention further provides an apparatus for transmitting packets with improved transmission reliability.

The transmitting apparatus comprises a redundancy information acquiring module and a transmitting module, wherein, the redundancy information acquiring module acquires redundancy information based on the payload of at least one transmitted packet and transmits the redundancy information out;

the transmitting module receives the redundancy information and transmits the redundancy information out.

The transmitting apparatus further comprises a packet segmenting module and a packet encapsulating module, wherein, the packet segmenting module segments the payload of each transmitted packet into n (an integer equal to or greater than 1) data blocks and transmits the data blocks to the redundancy information acquiring module;

the redundancy information acquiring module receives the data blocks from the packet segmenting module, extracts one data block from each of the n packets transmitted before the packet waiting for transmission, performs redundancy calculation for these extracted data blocks, takes the redundancy calculation result as the redundancy information, and transmits the redundancy information to the packet encapsulating module;

the packet encapsulating module receives the redundancy information from the redundancy information acquiring module, encapsulates the received redundancy information and the payload to be transmitted in the packet waiting for transmission, and then transmits the packet to the transmitting module.

Preferably, the transmitting apparatus further comprises a packet encapsulating module.

The redundancy information acquiring module determines the number of backup packets (represented by m, an integer equal to or greater than 1), backs up the payload of the m packets transmitted before the packet waiting for transmission, takes the backup data as the redundancy information, and transmits the redundancy information to the packet encapsulating module.

The packet encapsulating module receives the redundancy information from the redundancy information acquiring module, encapsulates the received redundancy information and the payload to be transmitted in the packet waiting for transmission, and then transmits the packet to the transmitting module.

Preferably, the transmitting apparatus further comprises a packet encapsulating module.

The redundancy information acquiring module determines the number of packets (represented by k, an integer equal to or greater than 1) required for calculating the redundancy information, organizes every k packets into a packet group, performs bitwise XOR operations on the payloads of all transmitted packets in each packet group, takes the XOR result as the redundancy information, and transmits the redundancy information to the packet encapsulating module.

The packet encapsulating module receives the redundancy information from the redundancy information acquiring module, encapsulates the received redundancy information in a redundancy check packet, and then transmits the packet to the transmitting module.

In relation to the transmitting apparatus, the present invention also provides a receiving apparatus to improve transmission reliability.

The receiving apparatus comprises a receiving module, a packet sequence checking module, and a packet error correcting module, wherein, the receiving module receives external packets and redundancy information and delivers the received packets and redundancy information to the packet sequence checking module;

the packet sequence checking module receives packets and redundancy information from the receiving module, checks the sequence number of each received packet, and if detecting a packet anomaly, delivers the received packets and the redundancy information related to the abnormal packet to the packet error correcting module;

the packet error correcting module receives the redundancy information from the packet sequence checking module and restores the payload of the abnormal packets according to the received redundancy information.

the packet sequence checking module determines the number of data blocks (represented by n) in each packet and delivers the data blocks of the (n−1) packets before the abnormal packet and the n packets after the abnormal packet and the redundancy information to the packet error correcting module;

the packet error correcting module receives the data blocks and redundancy information from the packet sequence checking module, and performs error correction calculation based on the data blocks of the (n−1) packets before the abnormal packet and the n packets after the abnormal packet and the redundancy information to restore the data blocks of the abnormal packet.

preferably, the packet sequence checking module determines the number of backup packets (represented by m, an integer equal to or greater than 1), identifies the packet where the payload of the abnormal packet is backed up according to the m and the place of the abnormal packet in the received packet, and delivers the packet to the packet error correcting module;

the packet error correcting module receives the packet from the packet sequence checking module, obtains the redundancy information from the received packet, and restores the payload of the abnormal packets according to the obtained redundancy information.

preferably, the packet sequence checking module determines the number of packets (represented by k, an integer equal to or greater than 1) in the packet group, identifies the packet group and redundancy check packet corresponding to the abnormal packet according to the k and the place of the abnormal packet in the received packets, and delivers the normal packets in the packet group and the redundancy check packet to the packet error correcting module;

the packet error correcting module receives the packets from the packet sequence checking module, extracts the redundancy information from the received redundancy check packet, performs bitwise XOR operations on the extracted redundancy information with the received normal packets, and takes the XOR result as the payload of the abnormal packet.

As is apparent from the solution, the present invention improves packet transmission reliability. To be specific, the present invention provides the following benefits:

The present invention acquires redundancy information from the payload of at least one transmitted packet and transmits the redundancy information to the receiver. Thus, the receiver can use the redundancy information to restore abnormal packets when it detects packet anomalies. In addition to restoring lost packets, the present invention allows the receiver to restore the payload of most out-of-order packets without having to wait for the out-of-order packets in the case of large-scale reordering. In this way, the present invention eliminates the negative effects caused by packet loss and packet reordering during packet transmission, guarantees packet transmission reliability, and improves quality of transmitted media streams.

In addition, an embodiment of the present invention transmits redundancy information in data packets, which lengthens the data packets but does not increase the number of packets to be transmitted. As on network devices such as switches and routers, the forwarding load mainly depends on the number of packets rather than packet length, the present invention avoids introducing extra forwarding load while delivering all its benefits.

DETAILED DESCRIPTION OF THE EMBODIMENTS

In the following detailed description of embodiments of the present invention, reference is made to the accompanying drawings for a complete understanding of the embodiments of the present invention.

The present invention provides a packet processing solution. The idea is that the transmitter acquires redundancy information based on the payload of at least one transmitted packet and transmits the redundancy information to the receiver; when the receiver determines that a packet anomaly has occurred, it restores the payload of the abnormal packet according to the redundancy information, thus ensuring transmission reliability.

Figure 1:
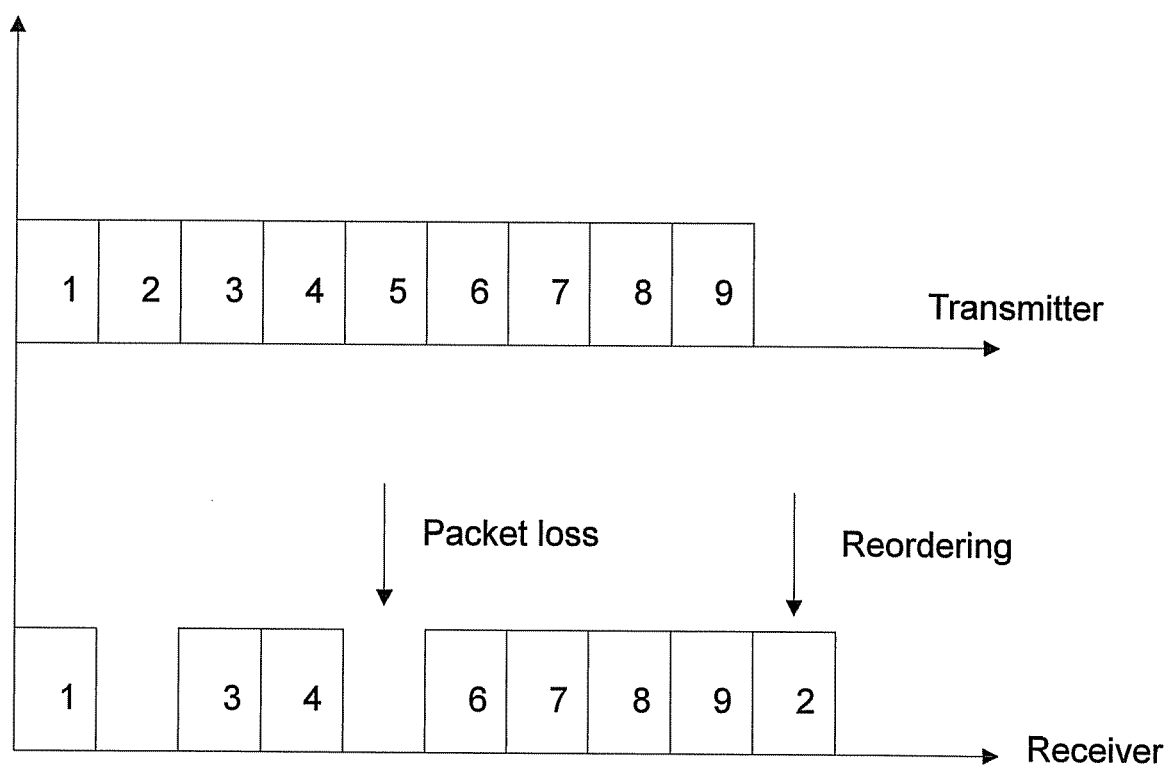
FIG. 1 is a schematic diagram illustrating packet anomalies in network transmission.
Figure 2:
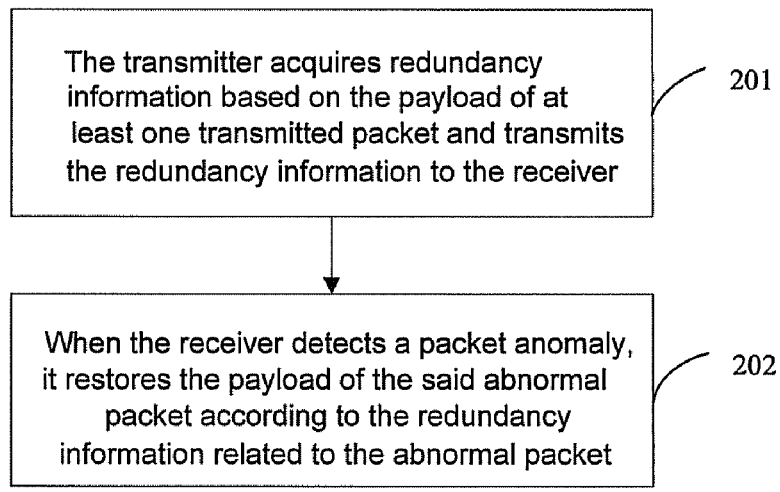
FIG. 2 illustrates a flow chart of packet processing in accordance with the present invention.

FIG. 2 illustrates a flow chart of packet processing according to the idea mentioned above, comprising these steps:

At step 201, the transmitter acquires redundancy information based on the payload of at least one transmitted packet and transmits the redundancy information to the receiver;

At step 202, when the receiver determines that an anomaly has occurred, it restores the payload of the abnormal packet according to the redundancy information related to the abnormal packet.

Wherein, the redundancy information is the result of a redundancy calculation or data backup performed based on the payloads of packets, and it makes packet recovery at the receiver possible.

According to the flow chart mentioned above and using the processing method shown in FIG. 2, the receiver can use the redundancy information to restore lost packets or out-of-order packets when large-scale reordering occurs. As the adverse effects that may be caused by packet loss and reordering are offset, transmission reliability is improved, so is the quality of the transmitted media stream.

The present invention is applicable to transport protocols incapable of error correction like UDP. In the subsequent descriptions of the present invention, UDP is used for example.

Figure 3:
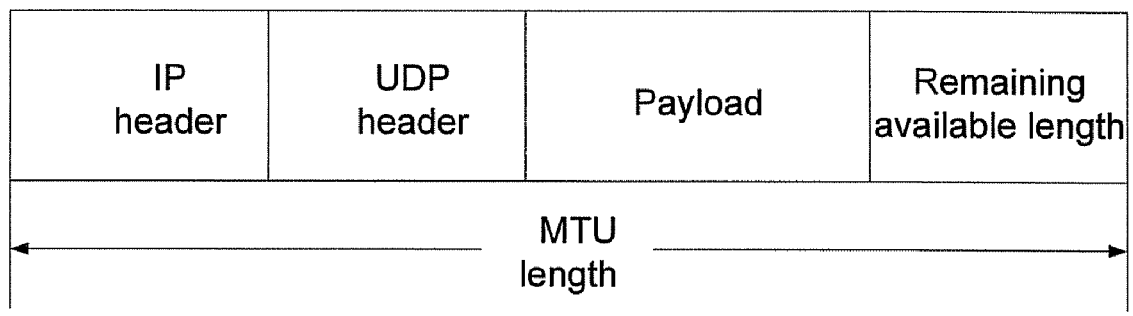
FIG. 3 illustrates a type of UDP packet format.

FIG. 3 shows the format of a type of UDP packet. As shown in FIG. 3, a UDP packet contains the IP header, UDP header, and payload, wherein the IP header identifies the start of the packet and contains the source address and destination address; the UDP header identifies the start of the UDP-encapsulated data in the packet and contains the source port, the destination port, the total length of the UDP header and the payload, and the checksum; the payload immediately follows the UDP header. According to the UDP protocol, the length of a UDP packet is less than the maximum transmission unit (MTU). Thus, a typical UDP packet usually contains some free bytes, called the remaining free length. The redundancy information thus can be stuffed into these free bytes and sent to the receiver together with the packet containing the payload. The space occupied by the added redundancy information is called the redundancy check block. Alternatively, the redundancy information can be encapsulated in a separate packet (called a redundancy check packet) and sent to the receiver.

How a packet is processed depends on where the redundancy information is added. In the following part, multiple embodiments of the present invention are given to describe the packet processing methods used when redundancy information is added to different places.

Embodiment 1

The present embodiment encapsulates redundancy information in to-be-transmitted packets that contains data payloads. To accommodate redundancy information in the remaining free length of a packet, the present embodiment segments the payload of UDP packets into data blocks, and acquires redundancy information from these data blocks.

Figure 4:
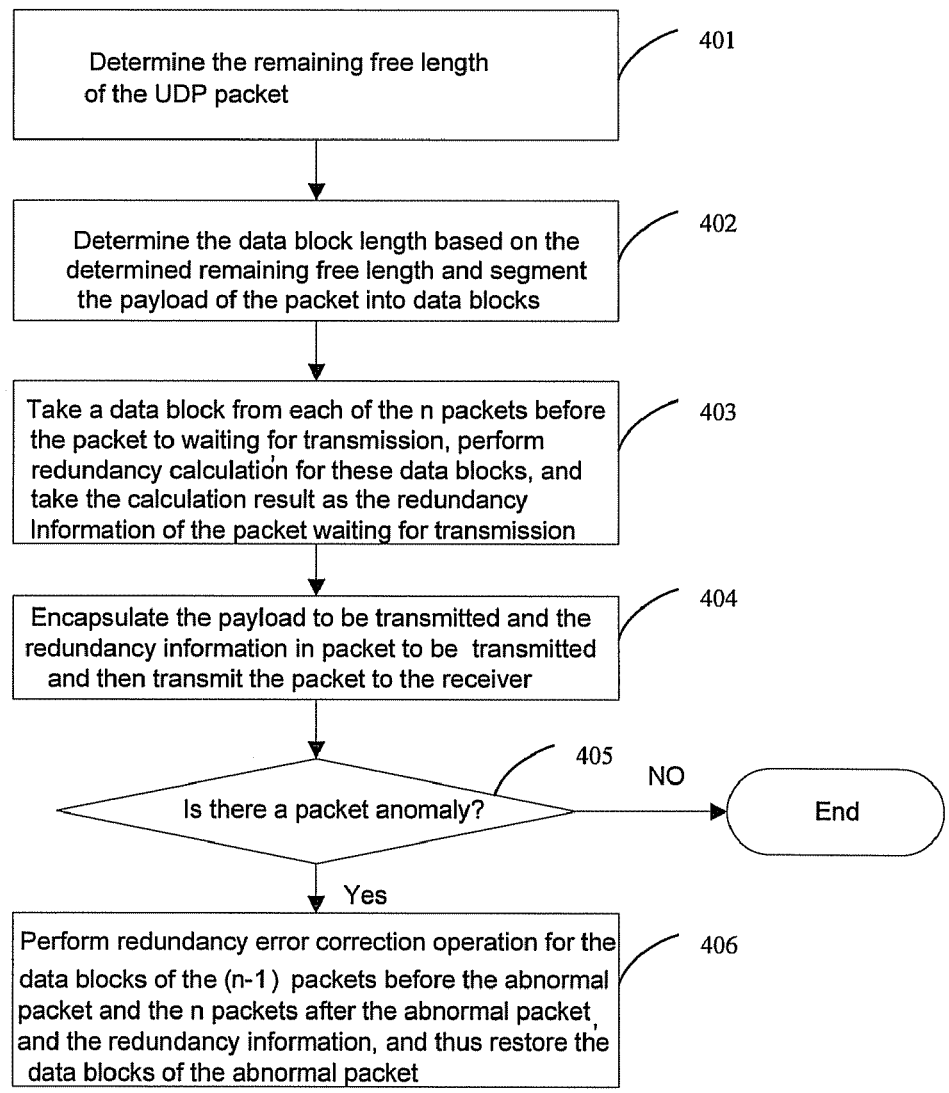
FIG. 4 illustrates a flow chart of packet processing in accordance with embodiment 1 of the present invention.

FIG. 4 is the flow chart of packet processing in accordance with embodiment 1 of the present invention, comprising these steps:

At step 401, the method identifies the remaining free length of the UDP packet.

Wherein, the method first checks the encapsulation format of the UDP packet, and then deducts the length of a packet in such an encapsulation format from the maximum transmission unit to get the remaining free length. The remaining free length is the maximum length of redundancy information that can be added. The longer the redundancy information is, the stronger the error correction capability is.

Take the commonly-used transport stream (TS) for transmitting video traffic as an example. When video traffic is transmitted, its elementary stream is first packetized, and then the packetized elementary stream together with the auxiliary data is packetized in a certain format and multiplexed into a transport stream. A transport stream consists of 188-byte TS packets. In Ethernet, the default MTU is 1500 bytes, restricting the maximum length of a packet to 1500 bytes. Therefore, up to seven TS packets can be encapsulated in one UDP packet. In practice, to reduce the number of transmitted packets, the approach of encapsulating seven TS packets in one UDP packet is mostly adopted.

Figure 5:
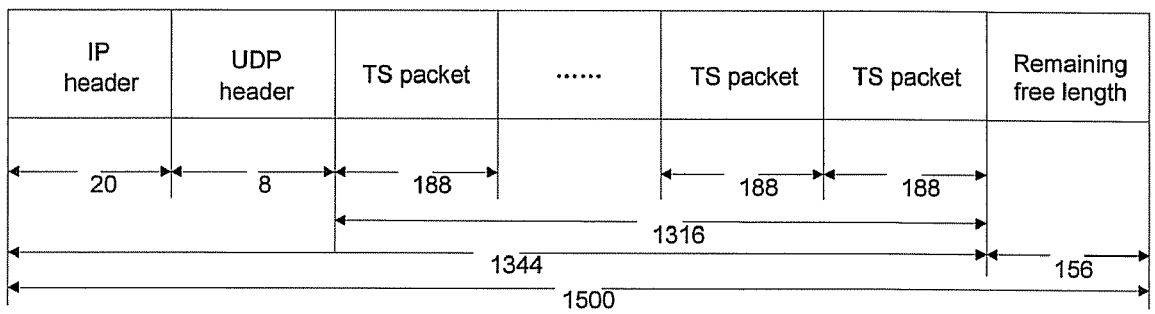
FIG. 5 illustrates the format of UDP packets encapsulating TS packets.

FIG. 5 shows the format of a UDP packet that encapsulates TS packets. As shown in FIG. 5, the UDP packet contains seven TS packets, the total length of which is 1316 bytes. 1316 bytes plus the 8-byte UDP header and the 20-byte IP header yields 1344 bytes, the total length of the IP-encapsulated UDP packet. Subtracting the 1344 bytes from the 1500 bytes results in 156 bytes, the remaining free length of the packet.

At step 402, the method determines the data block length based on the determined remaining free length and segments the payload of the packet into data blocks.

At this step, the method first determines the number of blocks (represented by n). The detailed operation is as follows: divide the length of the UDP packet payload by the remaining free length; if the result is an integer, take it as the minimum number of data blocks (represented by N) and if the result is not an integer, take the floor of the result plus one as the minimum number of data blocks N. Then, the method selects a number equal to or greater than the N as the actual number of data blocks (represented by n). The more blocks there are, the shorter each data block is. As data blocks are units of redundancy calculation, a shorter data block length results in shorter redundancy information and thus lower error correction capability. Therefore, the method preferably selects the minimum number of data blocks N as the actual number of data blocks n.

Then, the method divides the length of the UDP packet payload by the actual number of data blocks (represented by n). If the division result is an integer, the method takes the result as the data block length; if the result is not an integer, the method takes the floor of the result plus one as the data block length.

At last, the method segments the UDP packet payload into data blocks according to the determined data block length. Of the n data blocks, the first (n−1) data blocks are the same in length and their total length is less than or equal to the remaining free length, and the length of the $n^{th}$ data block is less than or equal to that of the $(n-1)^{th}$ data block.

For the UDP packet shown in FIG. 5, divide 1316 by the remaining free length 156, and add one to the floor of the division result to get 9, that is, the minimum number of data blocks. In this example, take 10 as the actual number of data blocks. Divide the total length of the seven TS packets 1316 by 10 to get 131.6. Add 1 to the floor of 131.6 (that is, 131) to get 132, that is, the data block length. Segment the UDP packet payload consisting of seven TS packets into 10 data blocks. Of the 10 data blocks, the first nine data blocks are each of 132 bytes, while the last data block is of (1316−132×9)=128 bytes.

As the data block length is determined to be 132 bytes, the redundancy information acquired from data blocks in the following steps will be of 132 bytes, less than the remaining free length 156 bytes.

As the UDP packet payload length is predefined, steps 401 and 402 are each executed once before the packet waiting for transmission is encapsulated and transmitted.

At step 403, the method takes one data block from each of the n packets transmitted before the packet waiting for transmission, performs redundancy calculation for these data blocks, and takes the calculation result as the redundancy information of the packet waiting for transmission.

Wherein, the number of packets that the redundancy calculation involves is the same as the actual number of data blocks n at step 402. When redundancy calculation is used for determining the redundancy information for the packet waiting for transmission, the packets from which data blocks are taken out for redundancy calculation are considered relevant to the packet waiting for transmission, and vice versa. When the packet whose data block S is used in the redundancy calculation is detected abnormal, the receiver can restore the data block S for the packet according to the other data blocks participating in the redundancy calculation and the redundancy calculation result.

As the UDP packet shown in FIG. 5 is segmented into 10 data blocks, the transmitter uses the data blocks of the 10 successive packets before the UDP packet waiting for transmission to construct a redundancy calculation matrix A as follows:

$$\begin{bmatrix} A_{1,1} & A_{2,1} & \ldots & \ldots & \ldots & A_{9,1} & A_{10,1} & A_{11,1} \\ A_{1,2} & A_{2,2} & \ldots & \ldots & \ldots & A_{9,2} & A_{10,2} & A_{11,2} \\ A_{1,3} & A_{2,3} & \ldots & \ldots & \ldots & A_{9,3} & A_{10,3} & A_{11,3} \\ \ldots & \ldots & \ldots & \ldots & \ldots & \ldots & \ldots & \ldots \\ A_{1,9} & A_{2,9} & \ldots & \ldots & \ldots & A_{9,9} & A_{10,9} & A_{11,9} \\ A_{1,10} & A_{2,10} & \ldots & \ldots & \ldots & A_{9,10} & A_{10,10} & A_{11,10} \\ \times & \times & \ldots & \ldots & \ldots & \times & \times & A_{11,11} \end{bmatrix}$$

Where, $A_{i,j}$ (i=1, 2, . . . , 11, j=1, 2, . . . , 10) represents the $j^{th}$ data block of the $i^{th}$ packet; the column number i represents the sequence number of a UDP packet, and the row number j represents the sequence number of the data block in the UDP packet. $A_{11,11}$ represents the redundancy check block formed by the redundancy information of the packet waiting for transmission. In the matrix, column 1 through column 10 represents the 10 UDP packets before the packet waiting for transmission; column 11 represents the packet waiting for transmission; x represents null. If $A_{i,j}$ is null, $A_{i,j}$ is set to 0; if $A_{i,j}$ is short in length, the deficient bits are set to 0. For example, the $10^{th}$ data block of the payload of each UDP packet is of 128 bytes, less than 132 bytes. During the calculation, the deficient bits are set to 0 automatically. This does not affect the calculation result, because in bitwise XOR calculation, a⊕0 still equals a.

The formula used to acquire redundancy information for the packet waiting for transmission is $A_{11,11}=A_{1,1} \oplus A_{2,2} \oplus \ldots \oplus A_{10,10}$, where ⊕ symbolizes bitwise XOR.

As is apparent, acquiring redundancy information for a packet waiting for transmission needs part of the data blocks of the 10 successive packets before the packet waiting for transmission, that is, each piece of redundancy information is relevant to part of the data blocks of the preceding 10 successive UDP packets.

At step 404, the payload of the packet waiting for transmission and the redundancy information are encapsulated in the packet waiting for transmission and then transmitted to the receiver.

At this step, the check identification code and redundancy information are added to the packet waiting for transmission, that is, the IP header, UDP header, all data blocks, the check identification code, and the redundancy information of the packet waiting for transmission are encapsulated in one packet and then transmitted to the receiver.

Figure 6:
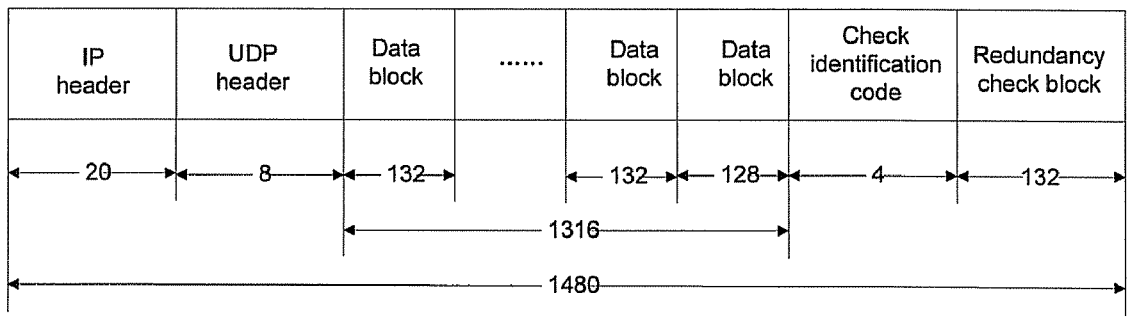
FIG. 6 illustrates the format of a type of UDP packet encapsulated in accordance with embodiment 1 of the present invention.

FIG. 6 is a schematic diagram illustrating the format of an encapsulated UDP packet in accordance with embodiment 1 of the present invention. As shown in FIG. 6, the 4-byte check identification code and 132-byte redundancy information are appended to the end of the payload of each UDP packet. The appended redundancy information forms a redundancy check block. The total length of the encapsulated UDP packet with the appended information is thus 1480 bytes, less than the default 1500-byte MTU in Ethernet.

Wherein, the check identification code functions to separate the data payload from the redundancy information in addition to identifying the redundancy information. When the receiver reads the check identification code, it realizes that the information after the check identification code is redundancy information. The check identification code can also contain the original sequence information of the packet. In this case, the receiver can acquire the original sequence information of the packet solely from the check identification code to determine whether packet loss or reordering has occurred, without having to check the sequence information in the IP header or UDP header for an error. If the check identification code is not used to identify redundancy information, the receiver can determine the starting byte of the redundancy information based on the data payload length. For example, as the data payload of the packet shown in FIG. 5 is of 1316 bytes, the length of the data payload plus the IP header and the UDP header equals 1344 bytes. Therefore, the starting byte of the redundancy information is the $1345^{th}$ byte.

In the present embodiment, the check identification code is set to 4 bytes. The check identification code can take the format of data block identifier of the transport stream+the cyclic accumulator identifying the packet sequence. For example, if the data block identifier of the transport stream is 47, then the check identification code is 0x4747xxxx, where xxxx represents the cyclic accumulator (in the range of 0 to 65535) identifying the place of the packet relative to all other packets. The receiver can acquire the original sequence information of a packet according to the cyclic accumulator value.

Note that, if the check identification code is used, its length will be deducted from the remaining free length at step 401 to get the actual remaining free length for redundancy information, so that the packet can contain both the redundancy information and the check identification code.

At step 405, the receiver determines whether a packet anomaly occurs. If yes, the receiver executes step 406; otherwise, this flow is completed. Wherein, a packet anomaly can be a lost packet or large-scale reordering.

At step 405, when the receiver receives the current packet, it acquires the original sequence information of the packet from the check identification code or the IP header and UDP header, and determines whether the currently received packet and the last packet are adjacent according to the original sequence information. If they are adjacent, the receiver determines that no packet anomaly occurs and ends the flow; otherwise, the receiver continues to receive packets and starts a timer. For example, if the sequence number of the current packet is 12 and its immediately preceding packet is 10, the receiver determines that packet 11 is lost. In this case, the receiver starts a timer while continuing to receive packets.

If the receiver receives packet 11 before the timer expires, it determines that no packet anomaly occurs and ends the flow. If the receiver fails to receive packet 11 when the predefined timer expires, it determines that a packet anomaly occurs and proceeds with the subsequent steps to restore the abnormal packet. The abnormal packet may be a lost packet or an out-of-order packet in a large-scale reordering.

As the UDP header contains the checksum field, when the transport layer of the receiver determines that the packet contains at least an error according to the checksum, it can perform error correction for the packet. If error correction fails, the packet is dropped. In this case, the receiver also considers that a packet anomaly occurs at step 405, and proceeds with the subsequent steps to restore the abnormal packet.

At step 406, the method performs redundancy-based error correction calculation for the data blocks of the (n−1) packets before the abnormal packet and the n packets after the abnormal packet and the redundancy information to restore the data blocks of the abnormal packet.

As the n equals 10 for the encapsulated UDP packet shown in FIG. 6, the method uses the data blocks of the nine successive packets before the abnormal packet and the 10 successive packets after the abnormal packet, the redundancy information, and the abnormal packet to construct matrix B as follows:

$$\begin{bmatrix} B_{1,1} & B_{2,1} & \cdots & B_{9,1} & B_{10,1} & B_{11,1} & B_{12,1} & \cdots & B_{20,1} \\ B_{1,2} & B_{2,2} & \cdots & B_{9,2} & B_{10,2} & B_{11,2} & B_{12,2} & \cdots & B_{20,2} \\ B_{1,3} & B_{2,3} & \cdots & B_{9,3} & B_{10,3} & B_{11,3} & B_{12,3} & \cdots & B_{20,3} \\ \cdot & \cdot & \cdots & \cdot & \cdot & \cdot & \cdot & \cdots & \cdot \\ B_{1,9} & B_{2,9} & \cdots & B_{9,9} & B_{10,9} & B_{11,9} & B_{12,9} & \cdots & B_{20,9} \\ B_{1,10} & B_{2,10} & \cdots & B_{9,10} & B_{10,10} & B_{11,10} & B_{12,10} & \cdots & B_{20,10} \\ B_{1,11} & B_{2,11} & \cdots & B_{9,11} & B_{10,11} & B_{11,11} & B_{12,11} & \cdots & B_{20,11} \end{bmatrix}$$

Where, $B_{i,j}$ (i=1, 2, ..., 20, j=1, 2, ..., 11) represents the $j^{th}$ data block of the $i^{th}$ UDP packet of the 20 successive packets received by the receiver; $B_{i,11}$ (i=1, 2, ..., 20) represents the redundancy information of the $i^{th}$ UDP packet. Assuming that the $10^{th}$ UDP packet is the abnormal packet, then $B_{10,j}$ (j=1, 2, ..., 10) represents the $j^{th}$ data block of the abnormal packet to be restored.

Note that bitwise XOR is performed on $B_{10,1}, B_{10,2}, \ldots, B_{10,10}$ by the transmitter to get $B_{20,11}, B_{19,11}, \ldots, B_{11,11}$ according to the following formulas:

$$B_{20,11} = B_{10,1} \oplus B_{11,2} \oplus B_{12,3} \oplus \ldots \oplus B_{19,10},$$

$$B_{19,11} = B_{9,1} \oplus B_{10,2} \oplus B_{11,3} \oplus \ldots \oplus B_{18,10},$$

$$\ldots$$

$$B_{11,11} = B_{1,1} \oplus B_{2,2} \oplus B_{3,3} \oplus \ldots \oplus B_{10,10}.$$

According to the bitwise XOR algorithm, if $a \oplus b \oplus c = d$, then $b \oplus c \oplus d = b \oplus c \oplus (a \oplus b \oplus c)$.

As $a \oplus a = 0$ and $a \oplus 0 = a$, then $b \oplus c \oplus d = a$.

Thus, the receiver can restore each data block of the abnormal packet by performing XOR operations on the elements in the error correction calculation matrix B according to the following formulas:

$$B_{10,1} = B_{11,2} \oplus B_{12,3} \oplus \ldots \oplus B_{19,10} \oplus B_{20,11},$$

$$B_{10,2} = B_{9,1} \oplus B_{11,3} \oplus \ldots \oplus B_{18,10} \oplus B_{19,11},$$

$$\ldots$$

$$B_{10,10} = B_{1,1} \oplus B_{2,2} \oplus B_{3,3} \oplus \ldots \oplus B_{11,11}.$$

In matrix B, if $B_{i,j}$ is null, then $B_{i,j}=0$; if $B_{i,j}$ is short in length, the deficient bits are set to 0.

Thus, the data blocks of the abnormal packet, that is, $B_{10,1}, B_{10,2}, \ldots, B_{10,10}$ are restored, and the UDP packet processing flow in accordance with embodiment 1 of the present invention is finished.

As is apparent, the present embodiment acquires redundancy information based on the payload of the packets before the packet waiting for transmission, encapsulates the redundancy information in the packet, and transmits the redundancy information to the receiver. When the receiver determines that a packet anomaly has occurred, it can restore the abnormal packet according to the payload and redundancy information in the packets relevant to the abnormal packet. This allows the receiver to restore the payload of most out-of-order packets without having to wait for the out-of-order packets. Thus, the present embodiment offsets the adverse effects caused by packet loss and packet reordering and guarantees UDP transmission reliability. As for media streams transmitted in UDP, the transmission quality is improved while real-time transmission is ensured.

In addition, the present embodiment transmits redundancy information in data packets, which lengthens the data packets but not the number of packets to be transmitted. Because on network devices such as switches and routers, the forwarding load mainly depends on the number of packets rather than packet length, the transmission approach avoids introducing extra forwarding load.

As is apparent from further calculation, when the payload of a packet is segmented into 10 data blocks, one packet of 20 successive packets is allowed to be dropped, that is, the tolerable packet loss ratio is $(1/20) \times 100\% = 5\%$. The number of TS packets encapsulated in the UDP packet shown in FIG. 5 is fixed to 7. In practice, the number may be less than 7. For example, to further enhance error correction capability, you can reduce the number of TS packets encapsulated in each UDP packet to increase the remaining free length. The longer the remaining free length is, the greater a data block can be. As the data block length increases, the number of data blocks that the payload of a UDP packet is segmented into decreases and so does the number of packets needed for restoring an abnormal packet.

In the following part, another example is given to further describe the packet processing method in accordance with embodiment 1 of the present invention. In this example, six TS packets are encapsulated in a UDP packet.

First, the method determines the remaining free length of the UDP packet, and then determines the data block length based on the remaining free length and segments the payload of the packet into data blocks.

In this example, the total length of the six TS packets in the UDP packet payload is $188 \times 6 = 1128$ bytes.

The remaining free length of the packet is $1500 - (188 \times 6 + 20 + 8 + 4) = 340$ bytes, where 4 is the length of the check identification code.

Based on the 340-byte remaining free length, the method determines the minimum number of data blocks to be 4. Take 4 as the actual number of data blocks, and divide the payload length 1128 (that is, $188 \times 6$) by 4 to get an integer 282. Then the method segments the payload of the UDP packets into four 282-byte data blocks.

When the transmitter sends a packet, it uses the data blocks of the four packets before the packet waiting for transmission to construct a redundancy calculation matrix similar to the matrix A, and then performs XOR calculation on the involved data blocks.

Figure 7:
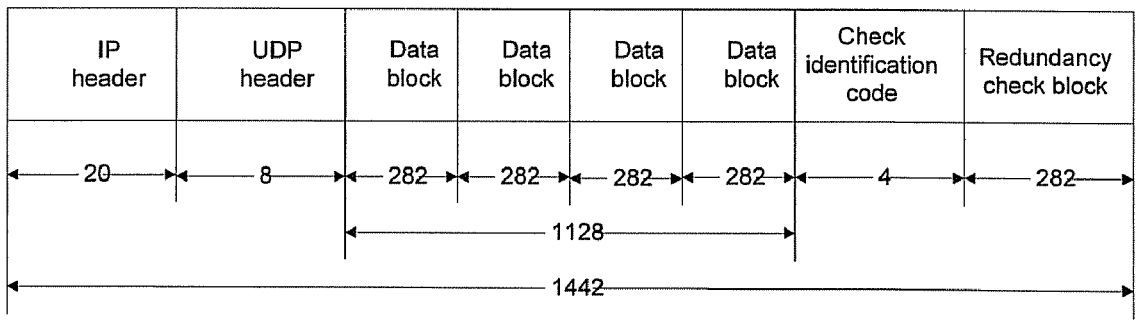
FIG. 7 illustrates the format of another type of UDP packet encapsulated in accordance with embodiment 1 of the present invention.

Then, the transmitter appends a 4-byte check identification code and the 128-byte redundancy information to the end of the UDP packet, where the redundancy information forms a redundancy check block, and transmits the packet to the receiver. FIG. 7 is a schematic diagram illustrating the format of an encapsulated UDP packet in accordance with the present example of embodiment 1 of the present invention. As shown in FIG. 7, the packet contains a 20-byte IP header, a 8-byte UDP header, four 282-byte data blocks, a 4-byte check identification code, and a 282-byte redundancy check block.

When the receiver determines that a packet anomaly has occurred, it uses the data blocks and redundancy information in the three packets before the abnormal packet and the four packets after the abnormal packet to construct an error correction calculation matrix similar to the matrix B to restore the abnormal packet.

Compared with the UDP packet containing 10 data blocks shown in FIG. 6, the UDP packet in the present example contains four data blocks. According to the XOR algorithm, the number of packets needed for restoring an abnormal packet becomes 7, that is, one packet of eight successive packets can be dropped with the tolerable packet drop ratio being 12.5%. In this way, the error correction capability is further enhanced.

The UDP packet processing method in accordance with the present embodiment also applies to UDP packets carrying data of other formats. So long as a certain remaining free length is available, you can append redundancy information to a UDP packet for error correction and data recovery, regardless of the format of carried data.

Embodiment 2

Figure 8:
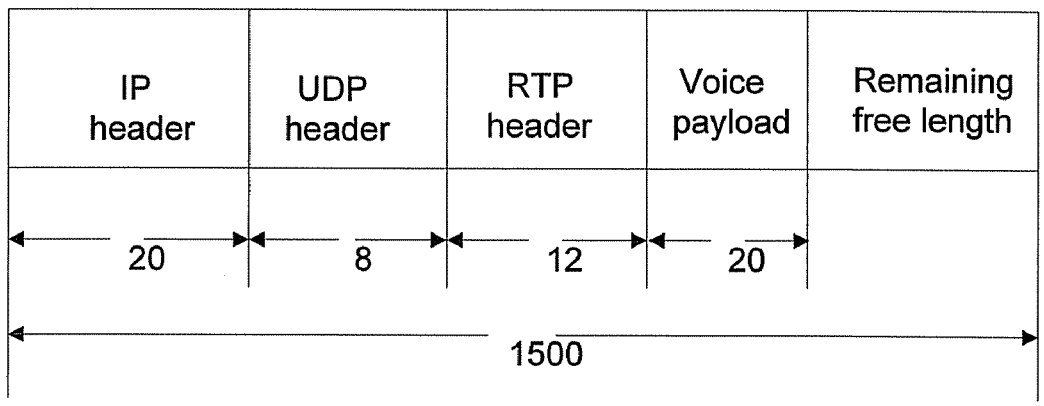
FIG. 8 is a schematic diagram illustrating the format of an RTP/UDP packet.

The present embodiment also appends redundancy information to packets containing data payloads. The difference between the present embodiment and embodiment 1 lies in that the present embodiment uses UDP packets to carry audio traffic, which is packetized into G.729 20-ms RTP packets, each of 60 bytes in length. FIG. 8 shows the format of an RTP/UDP/IP packet. As shown in FIG. 8, the packet contains a 20-byte IP header, 8-byte UDP header, 12-byte RTP header, and 20-byte voice payload. As is apparent, the length of the packet is far smaller than the default 1500-byte MTU in Ethernet. Therefore, such a UDP packet has a large free space for storing redundancy information needed to implement redundancy for successive packets.

In the present embodiment, as the remaining free length is greater than the payload length, the present embodiment does not segment the UDP packet payload; instead, it directly uses the UDP packet payload to acquire redundancy information.

Figure 9:
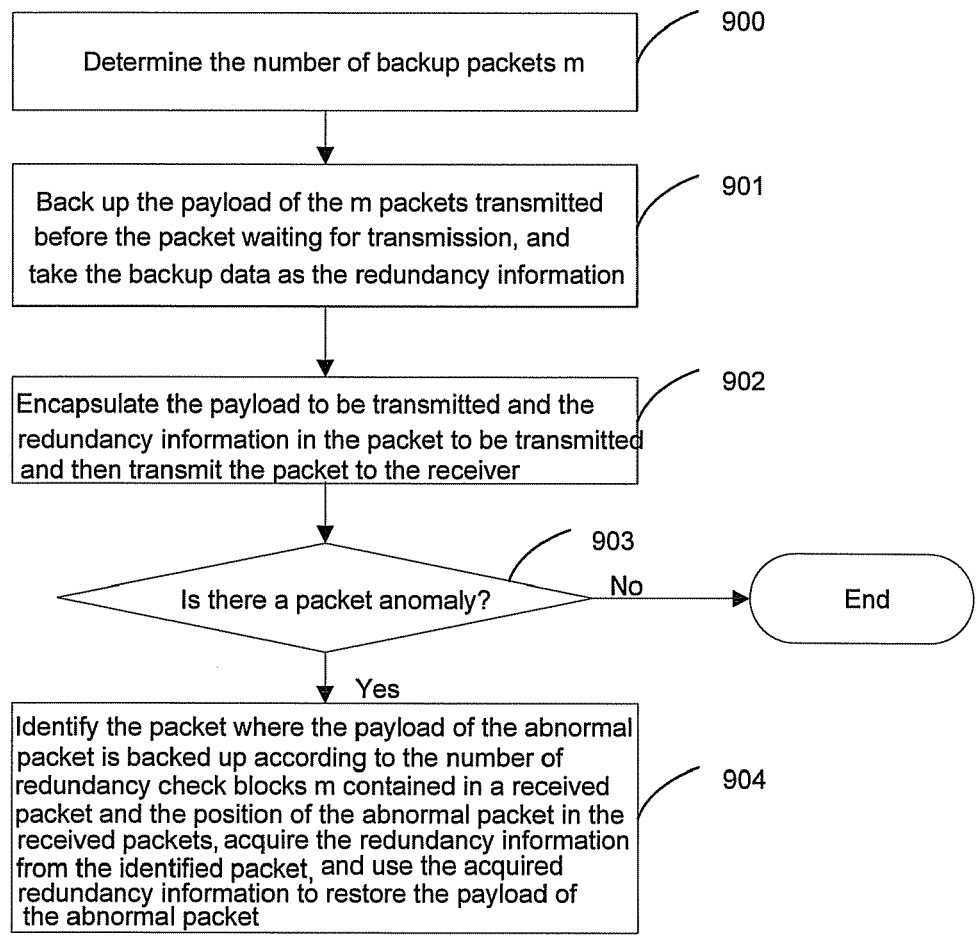
FIG. 9 illustrates a flow chart of packet processing in accordance with embodiment 2 of the present invention.

FIG. 9 is the flow chart of packet processing in accordance with embodiment 2 of the present invention, comprising these steps:

At step 900, the method determines the number of backup packets (represented by m, an integer equal to or greater than 1).

At this step, the method calculates the remaining free length in the same way as described at step 401. Then, the method divides the calculated remaining free length by the length of the payload of the transmitted packet, takes the floor of the division result as the maximum number of backup packets (represented by M), and then selects an integer less than or equal to M as the actual number of backup packets m.

For the UDP packet shown in FIG. 8, the remaining free length is $1500 - 20 - 8 - 12 - 20 = 1440$ bytes. Based on the remaining free length, the present embodiment sets the maximum number of backup packets M to 72. Here, take 2 as the actual number of backup packets for example. The voice payloads of two packets are of 40 bytes in total. Even if a 4-byte check identification code is added to each backup payload, the total length is only 48 bytes, satisfying the MTU constraint.

As the payload length of a UDP packet is predefined, this step is executed once before the packet waiting for transmission is encapsulated and transmitted.

At step 901, the method backs up the payload of the m packets transmitted before the packet waiting for transmission, and takes the backup data as the redundancy information.

At step 902, the payload of the packet waiting for transmission and the redundancy information are encapsulated in the packet waiting for transmission and then transmitted to the receiver.

The redundancy information contains at least one redundancy check block and each block backs up the payload of one packet. At this step, the data payload of the $i^{th}$ packet before the packet waiting for transmission is added to the packet waiting for transmission as the content of the $i^{th}$ redundancy check block, the payload of the packet waiting for transmission and the m redundancy check blocks are encapsulated and a check identification code is added before each redundancy check block at the same time, and then the encapsulated packet is transmitted to the receiver, where i=1, 2, ..., m.

Figure 10:
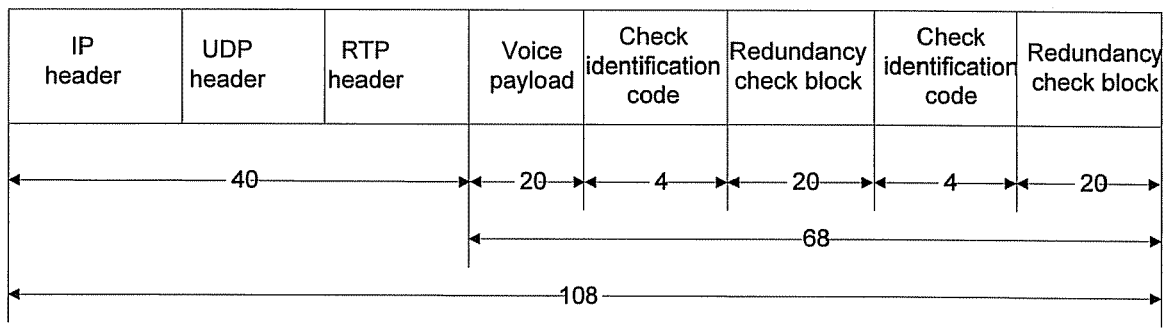
FIG. 10 illustrates the format of a type of UDP packet encapsulated in accordance with embodiment 2 of the present invention.

Let m be 2 for example. FIG. 10 is a schematic diagram illustrating the format of an encapsulated UDP packet in accordance with embodiment 2 of the present invention. As shown in FIG. 10, each encapsulated UDP packet contains a 20-byte IP header, an 8-byte UDP header, a 12-byte RTP header, a 20-byte voice payload, a 4-byte check identification code together with a 20-byte redundancy check block, and a 4-byte check identification code together with another 20-byte redundancy check block. Wherein, the first redundancy check block is the voice payload of the first packet before the packet waiting for transmission, and the second redundancy check block is the voice payload of the second packet (contiguous with the first packet) before the packet waiting for transmission.

The following diagram show the redundancy backup matrix C formed by ten successive UDP packets:

$$\begin{bmatrix} C_1 & C_2 & C_3 & C_4 & C_5 & C_6 & C_7 & C_8 & C_9 & C_{10} \\ 0 & C_1 & C_2 & C_3 & C_4 & C_5 & C_6 & C_7 & C_8 & C_9 \\ 0 & 0 & C_1 & C_2 & C_3 & C_4 & C_5 & C_6 & C_7 & C_8 \end{bmatrix}$$

Where, each column represents the voice payload of the current UDP packet and the two redundancy check blocks, and $C_i$ (i=1, 2, ..., 10) represents the voice payload of the $i^{th}$ packet of the ten packets. For example, the $8^{th}$ packet contains not only its own voice payload but also the voice payloads of the $7^{th}$ and $6^{th}$ packets.

At step 903, the receiver determines whether a packet anomaly occurs. If yes, the receiver executes step 904; otherwise, this flow is completed.

At step 904, the receiver identifies the packet where the payload of the abnormal packet is backed up according to the number of redundancy check blocks m contained in each received packet and the place of the abnormal packet relative to other received packets, and acquires the redundancy information from the identified backup packet to restore the data payload of the abnormal packet.

At this step, the redundancy information in each UDP packet contains the payloads of the m (an integer equal to or greater than 1) packets relevant to the UDP packet. The method takes any of the m packets after the abnormal packet as the packet of the abnormal packet, and then uses the content of the $i^{th}$ redundancy check block in the $i^{th}$ packet after the abnormal packet as the payload of the abnormal packet, where i=1, 2, ..., m.

Let m be 2 for another example. If columns 6 and 7 of the redundancy backup matrix C, which comprises 10 UDP packets, are lost, the data payload $C_6$ in column 6 can be restored according to the redundancy backup data $C_6$ in column 8, and the data payload $C_7$ in column 7 can be restored according to the redundancy backup data $C_7$ in column 8 or be restored according to the redundancy backup data $C_7$ in column 9.

Thus, the UDP packet processing flow in accordance with embodiment 2 of the present invention is completed.

The UDP packet processing method of embodiment 2 can improve UDP transmission reliability as embodiment 1 does to guarantee the quality of transmitted media streams. When the payload of the packet immediately before the packet waiting for transmission is repeatedly backed up to acquire the redundancy information, one packet of three successive packets is allowed to be dropped, that is, the tolerable packet loss ratio is 33.3%. When the payloads of the two packets before the packet waiting for transmission are repeatedly backed up to acquire redundancy information, two packets of three successive packets are allowed to be dropped, that is, the tolerable packet loss ratio is 66.7%. Note that using the method mentioned above to acquire redundancy information and add the acquired redundancy information to packets is space demanding. Therefore, the method is applicable only to UDP packets with small payloads and long remaining free length.

Both of the two embodiments described above add redundancy information to-be-transmitted packets containing payloads and then transmit the packets to the receiver. When the remaining free length of a UDP packet is less than or equal to the payload of the UDP packet, the remaining free length cannot accommodate the redundancy information acquired by repeated backup. In this case, it is necessary to use the UDP packet processing flow in accordance with embodiment 1, where the payload of the packet is segmented into data blocks and the redundancy information is acquired on a data block basis, so that the receiver can restore an abnormal packet according to the data blocks and redundancy information in the packets relevant to the abnormal packet. When the remaining free length of a UDP packet is greater than the payload of the UDP packet, the remaining space can hold the redundancy information acquired by repeated backup and thus segmentation is not needed. In this case, the UDP packet processing flow in accordance with embodiment 2 can be used, where redundancy information is acquired through repeated backup and the receiver can restore an abnormal packet according to the redundancy information in the packets relevant to the abnormal packet.

Embodiment 3

Different from embodiments 1 and 2, embodiment 3 encapsulates redundancy information in a separate redundancy check packet and transmits the packet to the receiver. Wherein, the method of acquiring redundancy information and restoring abnormal packets is different from the previous two embodiments.

Figure 11:
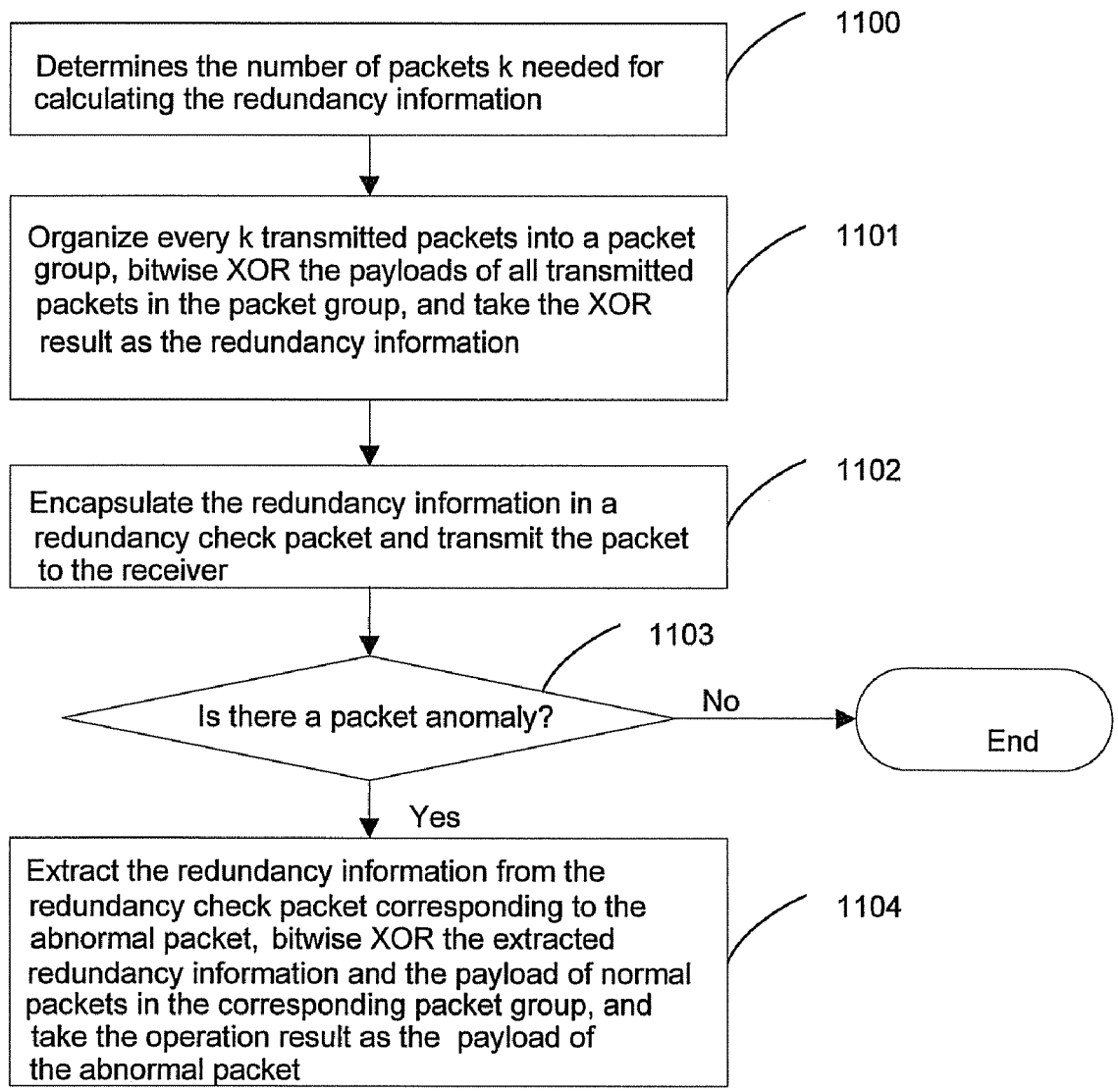
FIG. 11 illustrates a flow chart of packet processing in accordance with embodiment 3 of the present invention.

FIG. 11 is the flow chart of packet processing in accordance with embodiment 3 of the present invention, comprising these steps:

At step 1100, the method determines the number of packets (represented by k, an integer equal to or greater than 1) needed for calculating redundancy information.

At this step, the number of packets k can be determined depending on the required error correction capability. The packet loss ratio allowed in network transmission depends on k. One packet of k successive packets is allowed to be dropped, that is, the tolerable packet loss ratio is $1/k \times 100\%$. As is apparent, a smaller k means a higher allowed packet loss ratio and stronger error correction capability.

At step 1101, the transmitter organizes every k transmitted packets into a packet group, performs bitwise XOR operations on the payloads of all transmitted packets in the packet group, and takes the XOR result as the redundancy information.

At this step, the following formula is used to calculate the redundancy information D of the k packets:

$D = A_1 \oplus A_2 \oplus \ldots \oplus A_k$, where $A_j$ (i=1, 2, ..., k) represents the payload of the $j^{th}$ packet of the k packets in the packet group.

At step 1102, the transmitter encapsulates the redundancy information in a redundancy check packet and transmits the packet to the receiver.

At step 1103, the receiver determines whether any of the k packets is abnormal. If yes, the receiver executes step 1104; otherwise, this flow is completed.

At step 1105, the receiver extracts the redundancy information from the redundancy check packet corresponding to the abnormal packet, performs bitwise XOR operations on the redundancy information with the payload of the normal packets in the corresponding packet group, and takes the result as the payload of the abnormal packet.

At this step, the receiver first determines to which packet group the abnormal packet belongs. For example, if the transmitter sets k to 9 to organize nine packets into a packet group, then the $10^{th}$ packet is a redundancy check packet. When the receiver identifies that the sequence number of the abnormal packet is 28, it determines that the abnormal packet belongs to the group of packets 21 to 29. Therefore, packet 30 is the redundancy check packet for the abnormal packet. At this step, the receiver performs bitwise XOR operations on packets 21 through 27, packet 29, and packet 30 (the redundancy check packet) to restore the abnormal packet.

When the $x^{th}$ packet of the k packets is considered as an abnormal packet, the receiver performs bitwise XOR according to the following formulas to restore the abnormal packet:

when x=1, $A_1 = A_2 \oplus A_3 \oplus \ldots \oplus A_k \oplus D$, when x=2, $A_2 = A_1 \oplus A_3 \oplus \ldots \oplus A_k \oplus D$,

...

when x=k, $A_k = A_1 \oplus A_2 \oplus \ldots \oplus A_{k-1} \oplus D$,

As is apparent, $A_1, A_2, A_3, \ldots$, and $A_k$ are respectively relevant to redundancy information D.

Thus, the UDP packet processing flow in accordance with embodiment 3 of the present invention is completed.

The UDP packet processing method in accordance with the present embodiment transmits redundancy information in separate redundancy check packets, which do not contain the payloads of the transmitted media stream. Therefore, the redundancy information is not restricted by the remaining free length of packets. The packet processing method is applicable to the TS/UDP packets and RTP/UDP packets in embodiments 1 and 2. Using a simpler redundancy calculation algorithm, the method can guarantee UDP packet transmission reliability.

In addition, you can have the transmitter use the processing method in accordance with embodiment 1 or embodiment 2 to acquire redundancy information, encapsulate the acquired redundancy information in packets containing data payloads, and transmit the packets to the receiver, and after sending k packets containing the payloads and redundancy information, use the processing method in accordance with embodiment 3 to acquire redundancy information, and send a redundancy check packet. Thus, UDP packet transmission reliability is further guaranteed.

In the aforesaid three embodiments, the method of acquiring redundancy information on the transmitter and the method of restoring abnormal packets on the receiver are related to each other. In actual applications, after determining the method of acquiring redundancy information, the transmitter can notify the receiver of the method of acquiring redundancy information, and the receiver notify the transmitter of the method of restoring abnormal packets. Or, when the receiver determines that a data packet contains redundancy information and the length of the redundancy information is less than the payload length, it can identify that the transmitter acquires the redundancy information by segmenting payloads into data blocks and performing an XOR operation; when the receiver determines that a data packet contains redundancy information and the length of the redundancy information is equal to or greater than the payload length, it can identify that the transmitter acquires the redundancy information by backing up packets; when the receiver receives a redundancy check packet, it can identify that the transmitter acquires the redundancy information by performing an XOR operation on the payloads of k packets. Then, the receiver chooses the abnormal packet restoring method corresponding to the identified method of acquiring redundancy information.

Figure 12:
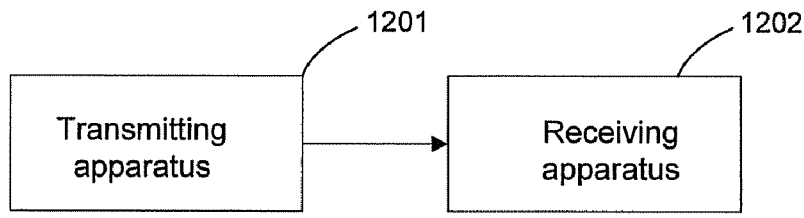
FIG. 12 is the block diagram of the packet processing system in accordance with the embodiments of the present invention.

To achieve the UDP packet processing methods of the present invention, embodiments of the present invention provide a UDP packet processing system. FIG. 12 is the block diagram of the packet processing system in accordance with embodiments of the present invention. As shown in FIG. 12, the system contains the transmitting apparatus 1201 and the receiving apparatus 1202.

Wherein, the transmitting apparatus 1201 acquires redundancy information based on the payload of at least one transmitted packet and transmits the redundancy information;

the receiving apparatus 1202 receives the redundancy information from the transmitting apparatus 1201, and after identifying a packet anomaly, restores the payload of the abnormal packet according to the redundancy information relevant to the abnormal packet.

The following part describes the blocks of the transmitting apparatus 1201 and the receiving apparatus 1202 in detail.

Figure 13:
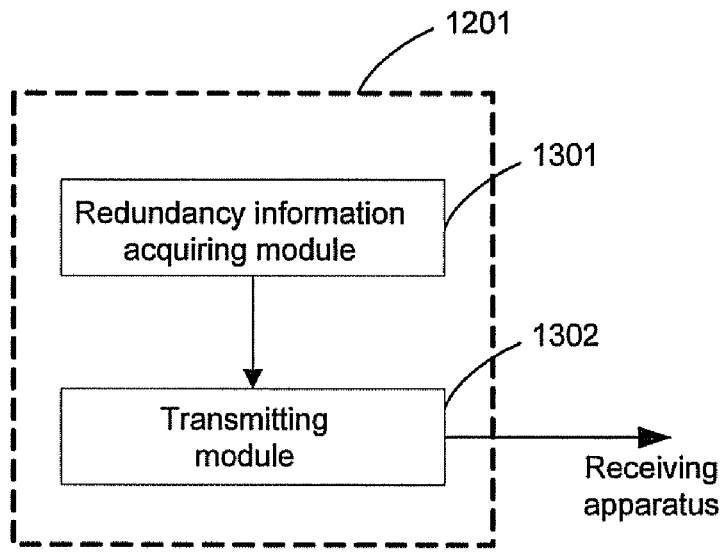
FIG. 13 is the block diagram of the packet transmitting apparatus in accordance with the present invention.

FIG. 13 shows the block diagram of the transmitting apparatus. As shown in FIG. 13, the transmitting apparatus 1201 comprises the redundancy information acquiring module 1301 and the transmitting module 1302.

The redundancy information acquiring module 1301 acquires the redundancy information based on the payload of at least one transmitted packet and transmits the redundancy information to the transmitting module 1302.

The transmitting module 1302 receives the redundancy information from the redundancy information acquiring module 1301 and transmits the redundancy information.

In the following part, the UDP packet transmitting apparatus in accordance with the three embodiments of the present invention is described in detail.

Figure 14:
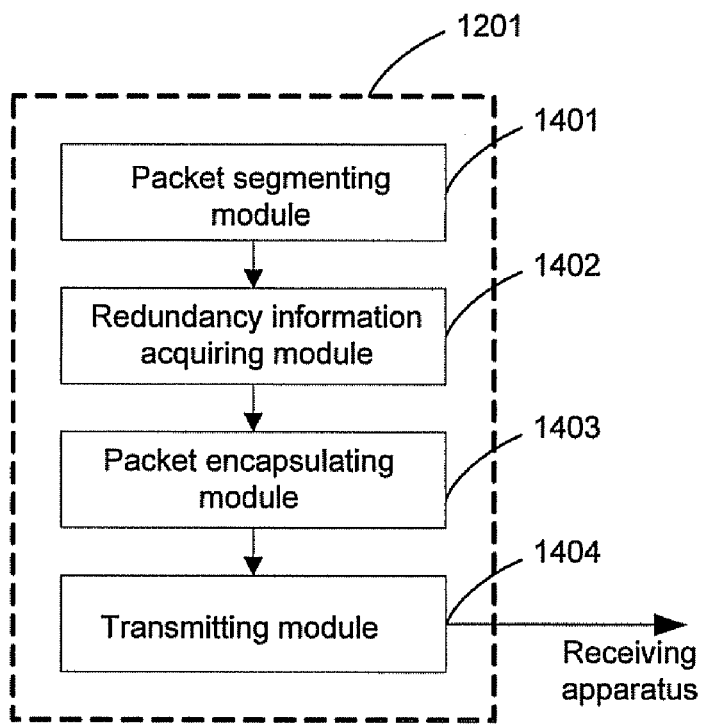
FIG. 14 is the block diagram of the packet transmitting apparatus in accordance with embodiment 1 of the present invention.

FIG. 14 shows the block diagram of the transmitting apparatus in accordance with embodiment 1 of the present invention. As shown in FIG. 14, the transmitting apparatus 1201 comprises the packet segmenting module 1401, the redundancy information acquiring module 1402, the packet encapsulating module 1403, and the transmitting module 1404.

The packet segmenting module 1401 segments the payload of each transmitted packet into n data blocks, where n is an integer equal to or greater than 1, and transmits the data blocks to the redundancy information acquiring module 1402.

The redundancy information acquiring module 1402 receives the data blocks from the packet segmenting module 1401, extracts one data block from each of the n packets transmitted before the packet waiting for transmission, performs redundancy calculations on the extracted data blocks, takes the calculations' result as the redundancy information, and transmits the redundancy information to the packet encapsulating module 1403.

The packet encapsulating module 1403 receives the redundancy information from the redundancy information acquiring module 1402, encapsulates the received redundancy information and the payload to be transmitted in the packet waiting for transmission, and then delivers the packet to the transmitting module 1404. When encapsulating the packet, the packet encapsulating module 1403 adds the check identification code, which is used to identify the redundancy check block and contains the original sequence information of the packet.

The transmitting module 1404 transmits the received packets.

Figure 15:
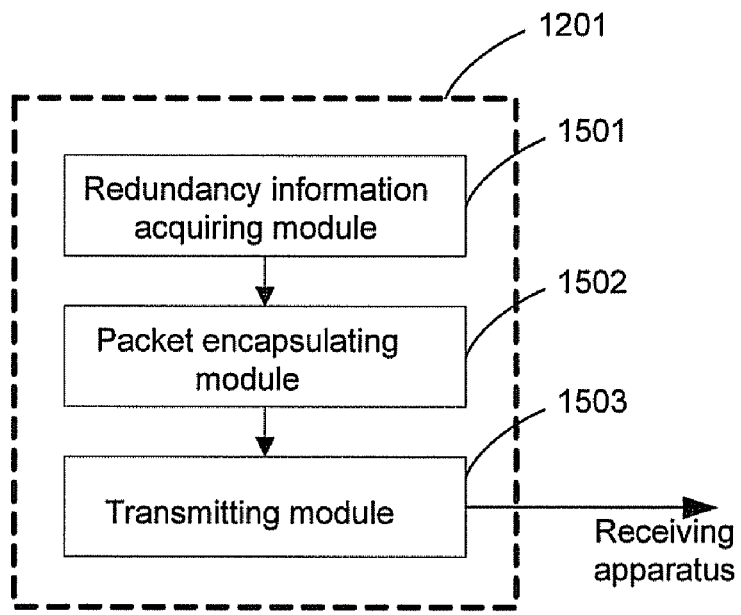
FIG. 15 is the block diagram of the packet transmitting apparatus in accordance with embodiment 2 of the present invention.

FIG. 15 shows the block diagram of the transmitting apparatus in accordance with embodiment 2 of the present invention. As shown in FIG. 15, the transmitting apparatus comprises the redundancy information acquiring module 1501, the packet encapsulating module 1502, and the transmitting module 1503.

The redundancy information acquiring module 1501 determines the number of backup packets (represented by m, an integer equal to or greater than 1), backs up the payloads of the m packets before the packet waiting for transmission, takes the backup data as the redundancy information, and delivers the redundancy information to the packet encapsulating module 1502.

The packet encapsulating module 1502 receives the redundancy information from the redundancy information acquiring module 1501, encapsulates the received redundancy information and the payload to be transmitted in the packet waiting for transmission, and then delivers the packet to the transmitting module 1503.

The transmitting module 1503 transmits the received packets containing the redundancy information.

As is apparent, compared with the transmitting apparatus in FIG. 14, the transmitting apparatus in accordance with embodiment 2 of the present invention does not include a packet segmenting module. To deal with more complex situations, a packet segmenting module can be added to the transmitting apparatus in accordance with the present embodiment. The packet segmenting module determines whether to segment the payload of a UDP packet based on the remaining free length of the UDP packet. If the packet segmenting module determines to segment the UDP packet, the packet segmenting module and the redundancy information acquiring module function as they do in FIG. 14; if not, the packet segmenting module and the redundancy information acquiring module function as they do in FIG. 15.

The transmitting apparatus in FIG. 15 also applies to embodiment 3. In this case, the redundancy information acquiring module 1501 determines the number of packets (represented by k, an integer equal to or greater than 1) required for calculating redundancy information, organizes every k packets into a packet group, bitwise XORs the payloads of the transmitted packets in each packet group, takes the XOR result as redundancy information, and transmits the redundancy information to the packet encapsulating module 1502.

The packet encapsulating module 1502 receives the redundancy information from the redundancy information acquiring module 1501, encapsulates the received redundancy information in a redundancy check packet, and then delivers the packet to the transmitting module 1503.

The transmitting module 1503 receives the redundancy check packet from the packet encapsulating module 1502 and then transmits the packet.

Figure 16:
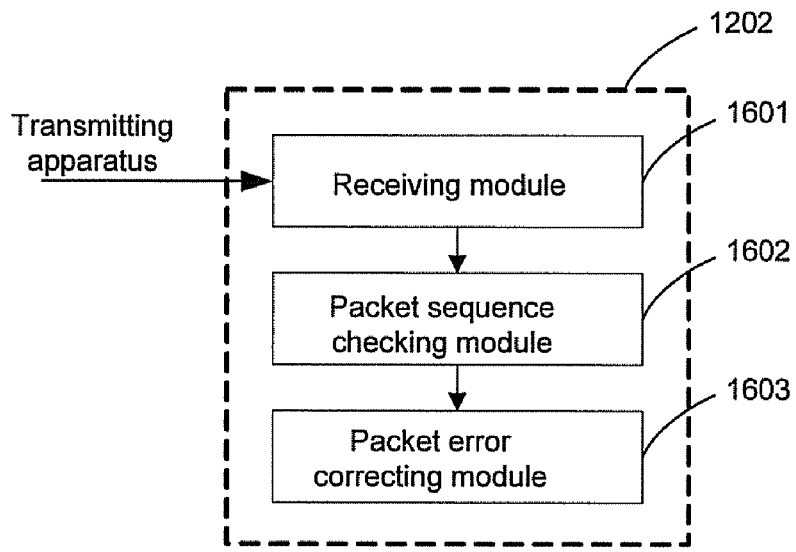
FIG. 16 is the block diagram of the packet receiving apparatus in accordance with the present invention.

FIG. 16 shows the block diagram of the receiving apparatus in accordance with the present invention. As shown in FIG. 16, the receiving apparatus 1202 comprises the receiving module 1601, the packet sequence checking module 1602, and the packet error correcting module 1603.

The receiving module 1601 receives an external packet and redundancy information and transmits the received packet and redundancy information to the packet sequence checking module 1602.

The packet sequence checking module 1602 receives the packet and redundancy information from the receiving module 1601, checks the sequence number of the received packet for a packet anomaly, and if it determines that a packet anomaly occurs, transmits the received packet and the redundancy information relevant to the abnormal packet to the packet error correcting module 1603.

The packet sequence checking module 1602 can determine whether packet loss or packet reordering occurs by acquiring original sequence information from the IP header and UDP header in the packet or by acquiring original sequence information from the check identification code in the packet.

The packet error correcting module 1603 receives the redundancy information from the packet sequence checking module 1602 and restores the payload of the abnormal packet according to the received redundancy information.

When the receiving apparatus in FIG. 16 is applied in embodiment 1, the receiving module 1601 receives external packets containing redundancy information and transmits the received packets to the packet sequence checking module 1602.

Upon detecting a packet anomaly, the packet sequence checking module 1602 determines the number of data blocks n in each packet and transmits the data blocks of the (n−1) packets before the abnormal packet and the n packets after the abnormal packet and the redundancy information to the packet error correcting module 1603.

The packet sequence checking module 1602 determines the number of data blocks n in each packet by segmenting the payload of the packet according to the redundancy information length and taking the number of resulting data blocks as n.

The packet error correcting module 1603 receives the data blocks and redundancy information from the packet sequence checking module 1602, and performs redundancy-based error correction calculation on the data blocks of the (n−1) packets before the abnormal packet and the n packets after the abnormal packet and the redundancy information to restore the data blocks of the abnormal packet.

When the receiving apparatus in FIG. 16 is applied in embodiment 2, the receiving module 1601 receives external packets containing redundancy information and transmits the received packets to the packet sequence checking module 1602.

Upon detecting a packet anomaly, the packet sequence checking module 1602 determines the number of backup packets (represented by m, an integer equal to or greater than 1), identifies the packet where the payload of the abnormal packet is backed up according to m and the place of the abnormal packet relative to the received packets, and delivers the backup packet to the packet error correcting module 1603.

The packet sequence checking module 1602 determines the number of backup packets (represented by m) by dividing the redundancy information length by the packet payload length and taking the result as m.

The packet error correcting module 1603 receives the packet from the packet sequence checking module 1602, acquires the redundancy information from the received packet, and restores the payload of the abnormal packet according to the acquired redundancy information.

When the receiving apparatus in FIG. 16 is applied in embodiment 3, the receiving module 1601 receives external redundancy check packets and groups of packets and delivers the received packets to the packet sequence checking module 1602.

The packet sequence checking module 1602 determines the number of packets (represented by k, an integer equal to or greater than 1) in each packet group, determines the packet group and the redundancy check packet corresponding to the abnormal packet according to k and the place of the abnormal packet in the received packets, and delivers the received normal packets in the packet group and the redundancy check packet to the packet error correcting module 1603.

The packet error correcting module 1603 receives the packet from the packet sequence checking module 1602, extracts the redundancy information from the received redundancy check packet, bitwise XORs the extracted redundancy information with the received normal packets, and takes the calculation result as the payload of the abnormal packet.

The packet processing solution provided by the present invention can restore the payload of the abnormal packets to improve transmission reliability and thus the quality of voice and video streams.

Although several embodiments of the invention and their advantages are described in detail, a person skilled in the art could make various alternations, additions, and omissions without departing from the spirit and scope of the present invention as defined by the appended claims.

What is claimed is:

1. A method, in a packet transmitter, for assembling and transmitting a series of packets to a packet receiver, wherein each packet in the series contains p data blocks and a redundancy block, wherein the packet transmitter is communicatively coupled to a network, and, for a given packet in the series, the method comprising:
   assembling a first set of p data blocks to form an intermediate representation of the given packet;
   calculating a given redundancy block from a second set of p data blocks, wherein exactly one of the p data blocks in the second set is from each of an immediately previous p packets in the series, wherein the given redundancy block is of a given length, and wherein the given length is based on a remaining free length in the intermediate representation of the given packet;
   combining the intermediate representation of the given packet with the given redundancy block to form the given packet; and
   transmitting the given packet to the packet receiver via the network.

2. The method of claim 1, wherein the remaining free length is based on a length of the intermediate representation of the given packet subtracted from a maximum transmission unit (MTU) length associated with the given packet.

3. The method of claim 1, wherein each data block of the second set of p data blocks appears at a different offset in its respective immediately previous packet in the series.

4. The method of claim 1, wherein the given redundancy block is calculated by performing an XOR function over the second set of p data blocks.

5. The method of claim 1, further comprising:
   backing up payloads of the immediately previous p packets, and wherein the given redundancy block is calculated based on the backed up payloads.

6. The method of claim 1, wherein combining the intermediate representation of the given packet with the given redundancy block further comprises placing a check identification code in the given packet before the given redundancy block.

7. The method of claim 1, wherein an arrangement of the first set of p data blocks represents an extent of transport stream (TS) packets.

8. The method of claim 7, further comprising:
   receiving the extent of TS packets;
   arranging the extent of TS packets in order of reception by the packet transmitter; and
   determining the first set of p data blocks based on the arranged extent of TS packets.

9. A packet transmitter, communicatively coupled to a network and arranged to transmit a series of packets to a packet receiver, the packet transmitter comprising:
   a packet segmenting module for segmenting a first packet into a first set of p data blocks;
   a redundancy information acquiring module for calculating a given redundancy block from a second set of p data blocks, wherein exactly one of the p data blocks in the second set is from each of an immediately previous p packets in the series, wherein the given redundancy block is of a given length, and wherein the given length is based on a remaining free length in the first packet;
   a packet encapsulating module for combining the first set of p data blocks with the given redundancy block to form second packet; and
   a transmitting module for transmitting the second packet to the packet receiver via the network.

10. The packet transmitter of claim 9, wherein the remaining free length is based on a total length of the first set of p data blocks subtracted from a maximum transmission unit (MTU) length associated with the first packet.

11. The packet transmitter of claim 9, wherein each data block of the second set of p data blocks appears at a different offset in its respective immediate previous packet in the series.

12. The packet transmitter of claim 9, wherein the given redundancy block is calculated by performing an XOR function over the second set of p data blocks.

13. The packet transmitter of claim 9, further comprising:
   the redundancy information acquiring module also backing up payloads of the immediately previous p packets, and wherein calculating the given redundancy block comprises calculating the given redundancy block based on the backed up payloads.

14. The packet transmitter of claim 9, wherein combining the first set of p data blocks with the given redundancy block further comprises placing a check identification code before in the second packet before the given redundancy block.

15. The packet transmitter of claim 9, wherein an arrangement of the first set of p data blocks represents an extent of transport stream (TS) packets.

16. The packet transmitter of claim 15, wherein the packet segmenting module is also for (i) receiving the extent of TS packets, (ii) arranging the extent of TS packets in order of reception by the packet transmitter to form the first packet, and (iii) determining the p data blocks from the arranged extent of TS packets in the first packet and the remaining free length in the first packet.

17. A method, in a packet receiver, for reconstructing a lost packet from a series of packets, wherein each packet in the series contains a redundancy block calculated from a first set of p data blocks, wherein exactly one data block of the first set is from each of an immediately previous p packets in the series, wherein the lost packet contains an extent of transport stream (TS) packets, the method comprising:

calculating a second set of p data blocks based on at least (i) p redundancy blocks contained in an immediately following p packets in the series, (ii) data blocks contained in the immediately following p packets in the series, and (iii) data blocks contained in an immediately preceding p−1 packets in the series;

assembling the lost packet from the second set of p data blocks; and extracting the extent of TS packets from the lost packet.

18. The method of claim 17, wherein each redundancy block contains a check identification code, the method further comprising:

determining original sequence information of each packet in the series from check identification codes contained in the respective packet's redundancy block.

19. The method of claim 17, wherein calculating the second set of p data blocks comprises performing an XOR function to determine each of the second set of p data blocks.

20. The method of claim 17, wherein each of the second set of p data blocks are of a data block length.

21. The method of claim 20, wherein the data block length is based on a length of the extent of TS packets in the lost packet subtracted from a maximum transmission unit (MTU) length associated with the lost packet.

* * * * *